(12) United States Patent
Yao

(10) Patent No.: US 9,054,278 B2
(45) Date of Patent: Jun. 9, 2015

(54) LIGHTING APPARATUSES AND DRIVING METHODS REGARDING TO LIGHT-EMITTING DIODES

(71) Applicant: EPISTAR CORPORATION, Hsinchu (TW)

(72) Inventor: Chiu-Lin Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/079,580

(22) Filed: Nov. 13, 2013

(65) Prior Publication Data
US 2014/0131749 A1 May 15, 2014

(30) Foreign Application Priority Data
Nov. 14, 2012 (TW) .............................. 101142570 A

(51) Int. Cl.
*H01L 33/00* (2010.01)
*H01L 33/44* (2010.01)
*H01L 25/075* (2006.01)
(Continued)

(52) U.S. Cl.
CPC ............ *H01L 33/44* (2013.01); *H01L 25/0753* (2013.01); *H01L 33/50* (2013.01); *H01L 33/54* (2013.01); *H01L 2224/48091* (2013.01); *H01L 2224/48137* (2013.01); *H01L 2224/8592* (2013.01); *H01L 2924/19107* (2013.01); *H01L 24/45* (2013.01); *H01L 2224/45144* (2013.01); *H01L 2224/45147* (2013.01)

(58) Field of Classification Search
CPC ......... H01L 33/08; H01L 33/44; H01L 33/54; H01L 33/50; H01L 25/0753; H01L 25/075; H01L 25/18; H01L 24/45; H01L 2224/48091; H01L 2224/45144; H01L 2224/8592; H01L 2224/48137; H01L 2224/45147; H01L 2924/19107; H01L 2924/00014
USPC .......................... 257/89, 88, 98; 315/160, 291
See application file for complete search history.

(56) References Cited

U.S. PATENT DOCUMENTS 7,455,423 B2 * 11/2008 Takenaka ....................... 362/231
7,759,854 B2 * 7/2010 Miller et al. ................... 313/498
(Continued)

*Primary Examiner* — Nikolay Yushin
(74) *Attorney, Agent, or Firm* — Muncy, Geissler, Olds & Lowe P.C.

(57) ABSTRACT

Disclosed are a lighting apparatus and its driving method. A disclosed lighting apparatus comprises a blue light-emitting diode die, a red light-emitting diode die, an electrical-connection structure connecting the blue light-emitting diode die and the red light-emitting diode die and having a correlated color temperature $T_N$. A disclosed driving method of a lighting apparatus comprising operating a blue light-emitting diode emitting a first color light with an electrical power $W_B$ consumed and operating a red light-emitting diode die emitting a second color light with an electrical power $W_R$ consumed, respectively. Then, the correlated color temperature of the lighting apparatus is about $T_N$, and a power ratio $R_W$, the ratio of $W_B$ over $W_R$, is about between $7.67*\ln(T_N)-56.6$ and $5.01*\ln(T_N)-37.2$.

20 Claims, 4 Drawing Sheets

(51) Int. Cl.
   *H01L 33/50* (2010.01)
   *H01L 33/54* (2010.01)
   *H01L 23/00* (2006.01)

(56) References Cited

U.S. PATENT DOCUMENTS

| | | | |
|---|---|---|---|
| 8,395,311 B2* | 3/2013 | Morimoto | 313/500 |
| 8,410,714 B2* | 4/2013 | Kasakura et al. | 315/287 |
| 2005/0030744 A1* | 2/2005 | Ducharme et al. | 362/231 |
| 2006/0245188 A1* | 11/2006 | Takenaka | 362/231 |
| 2007/0223219 A1* | 9/2007 | Medendorp et al. | 362/231 |
| 2007/0267983 A1* | 11/2007 | Van De Ven et al. | 315/294 |
| 2008/0297054 A1* | 12/2008 | Speier | 315/152 |
| 2010/0219770 A1* | 9/2010 | Kim et al. | 315/294 |
| 2010/0295464 A1* | 11/2010 | Kasakura et al. | 315/287 |
| 2013/0093362 A1* | 4/2013 | Edwards | 315/313 |

* cited by examiner

_(1)_

LIGHTING APPARATUSES AND DRIVING METHODS REGARDING TO LIGHT-EMITTING DIODES

BACKGROUND

1. Related Application

This application claims a priority of a previously filed TW Patent Application No. 101142570 filed on Nov. 14, 2012, entitled as "Lighting apparatuses and driving methods regarding to light-emitting diodes", and the entire contents of which are hereby incorporated by reference herein in its entirety.

2. Technical Field

The present disclosure relates to a light-emitting diode and in particular to a lighting apparatus having a high color rendering index (CRI) using a light-emitting diode and related driving methods.

3. Description of the Related Art

The light-emitting diode (LED) is a lighting source made of semiconductors. Since the LEDs have the characteristics of long operational life, low power consumption, and light weight, the LEDs are gradually replacing traditional lighting parts such as incandescent light bulbs. The colors of lights emitted by the LEDs are determined by the semiconductor material used to manufacture the LEDs.

Some semiconductor materials of LEDs are alloys of groups III-V, such as gallium nitride (GaN). Generally, the alloys are epitaxially deposited by layer on a substrate made of silicon carbide or sapphire base during the manufacturing process. The alloys can be doped with p-type or n-type impurities to adjust the electrical properties. The LED based on GaN emits a light having a color close to ultraviolet (UV) or blue in a light spectrum.

The phosphor layer is coated on LED for lighting application. The phosphor is a photoluminescence material which absorbs an electro-magnetic wave on a part of the light spectrum and emits another electro-magnetic wave on another part of the light spectrum. Thus, when LED is covered by phosphor layer, the light emitted by the LED which is not absorbed by the phosphor layer and a light emitted by the phosphor layer are mixed to be a light having a desired color and a luminance.

Take white light as an example, the LED emitting white light incorporates a blue light LED which has a light-emitting layer made of InGaN covered by a phosphor layer which turns a part of the blue light emitted from the blue light LED into a yellow light or yellow-green light. When the white light LED is turned on, the semiconductor in the blue light LED turns the electrical power into a blue light (or UV light) and part of it is absorbed by the phosphor and becomes a yellow-green light (or yellow light). Since the yellow light or yellow-green light is substantially the complementary color of the blue light, the combination of the yellow light and the blue light is considered as a white light in human's eye. Some characteristics of a white light source are important to be taken into consideration, such as correlated color temperature (CCT) and color rendering index (CRI), to illustrate how close the light emitted by the white light source is when compared with a light in nature.

Color temperature is indicated by Kelvin scale (° K) which represents a color of an ideal black body at that color temperature. Generally speaking, an incandescent light bulb is close to an ideal black body on a light spectrum. While an incandescent light bulb is heated to 2000° K, a red light is emitted. With an increase of the temperature, the light turns from orange-red to yellow gradually. When it is 5000° K, the light is substantially a white light. When it is 8000° K, the light is substantially a blue light. Simply speaking, the higher the temperature is the larger blue proportion the light has; the lower the temperature is the larger red proportion of the light has. Because many light spectrums of artificial light sources are not the same as the light spectrum of the ideal black body, the correlated color temperatures (CCT) are used to represent their color temperature. If an artificial light source emits a light having a combination of color which is similar to a combination of a light emitted by an ideal black body at a color temperature, the CCT of the artificial light source is defined as the color temperature of the light emitted by the artificial light source. Many methods are used to estimate a CCT of a white light from its chromaticity coordinates. Although the methods are different, the difference of the estimated CCTs is small.

Generally, a definition of CRI is the performance of eight chosen colors radiated by a white light source. A highest CRI value of a white light source is 100 when the eight colors are fully reproduced. The lower CRI indicates a larger bias is appeared when the eight colors are radiated by that white light source. There is other CRI definition using fourteen colors for evaluation. In this specification, the CRI generally refers to the definitions described above or any results from similar definition.

A well-known white light LED adopts a combination of a blue light diode having a peak-emission wavelength about 440 nm to 480 nm and a YAG phosphor consisted of cerium doped yttrium aluminum. The YAG phosphor turns a part of the blue light into yellow-green light. A light combination of a blue light and a yellow-green light is considered as a white light to human's eye.

Recently, the white light LED is difficult to reach a desired CRI and a CCT. Since the light emitted by the white light LED usually has two peaks on a light spectrum locate near blue light and yellow-green light respectively and lacks a red light having a lower wavelength needed to adjust CRI and CCT. Therefore, it is difficult to lower the CCT of a white light LED mentioned above to below 5000° K, and the CRI is normally lower than 75.

A method to decrease CCT and to increase CRI of a white light LED is to change the composition of the phosphor. For example, the phosphor layer has at least two phosphors: one is a YAG phosphor which is used to generate yellow-green light, and another phosphor is used to generate a red light. Then, the white light LED has peaks on frequencies of a spectrum near blue light, yellow-green light, and red light respectively. A desired CCT and a CRI are achieved by adjusting the ratios and peak values of the peaks. But, the energy transition efficiency of the phosphor which generates a red light is poor and the light emitting efficiency of a white light LED is reduced.

SUMMARY OF THE DISCLOSURE

An embodiment of the application disclosed a lighting apparatus comprises one blue light-emitting diode die, one red light-emitting diode die, and an electrical-connection structure. The blue and red light-emitting diode dies are capable of emitting first and second color lights, respectively. The electrical-connection structure is adapted for electrically connecting and lighting the blue and red light-emitting diode dies. When lighting, the blue and red light-emitting diode dies respectively consume electrical powers $W_B$ and $W_R$, and the correlated color temperature of the lighting apparatus is about $T_N$. Power ratio $R_W$, the ratio of $W_B$ over $W_R$, is about between $7.67*\ln(T_N)-56.6$ and $5.01*\ln(T_N)-37.2$.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
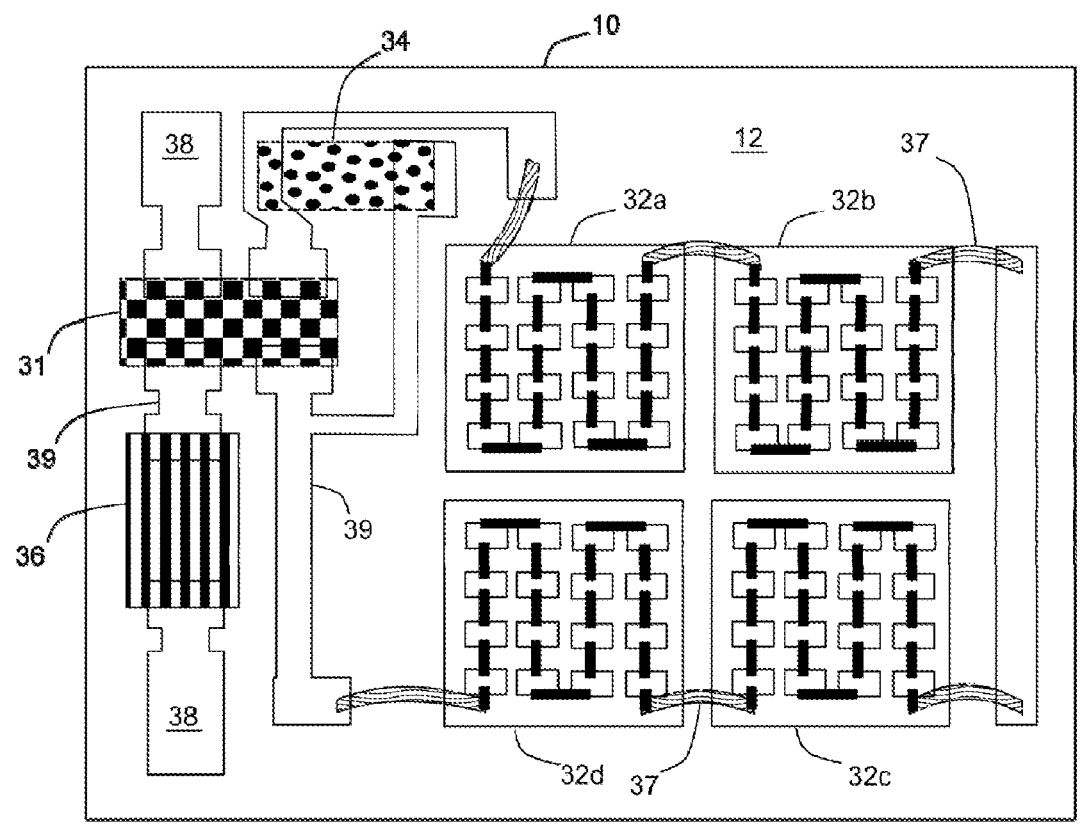
FIG. 1 shows a white light LED in accordance with an embodiment of the present disclosure.
Figure 2:
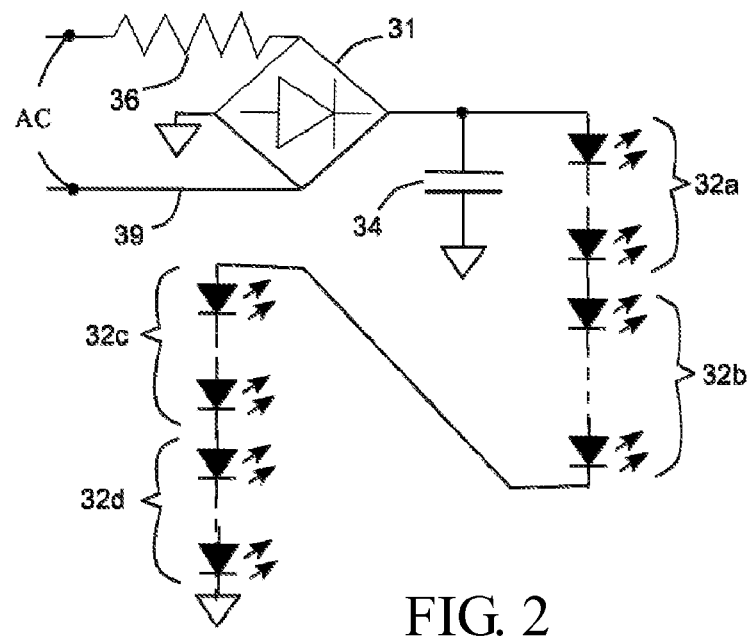
FIG. 2 shows an equivalent circuit schematic view of the white light LED shown in FIG. 1.

FIG. 1 discloses a white light LED 10 in accordance with an embodiment of the present disclosure. The white light LED 10 can be a circuit-on-board (COB) package which comprises a submount 12, a rectifier 31, four light-emitting diode dies 32a~32d, a filter capacitor 34, a current limiting resistor 36, a bonding pad 38, and an electrical-connection structure. The electrical-connection structure has a bonding wire 37 and conductive strips 39 on the submount 12. FIG. 2 shows an equivalent circuit schematic view of the white light LED 10 shown in FIG. 1.

High voltage utility power in an alternating mode of 110ACV or 120ACV for example can be provided to the white light LED 10 from the bonding pad 38 on the submount 12. The rectifier 31, which can be a bridge rectifier, is attached to the submount 12 to turn the high voltage utility power in an alternating mode in to a direct current power source. The current limiting resistor 36 is used to limit the amount of the current passing through the white light LED 10. The filter capacitor 34 is used to regulate the voltage cross the two output ports of the rectifier 31 in order to provide a stable voltage to the light-emitting diode dies. The light-emitting diode dies 32a-32d are placed on the submount 12 and a bonding wire 37 is configured to connect the light-emitting diode dies 32a-32d to form a series-connected structure and the current passing through the light-emitting diode dies can be the same amount. At least one of the light-emitting diode dies 32a-32d is a red light-emitting diode die and the rest of the light-emitting diode dies are blue light-emitting diode dies. Through the electrical-connection structure, the direct current power source on the filter capacitor 34 can be provided to the light-emitting diode dies 32a-32d for emitting a light.

Figure 3:
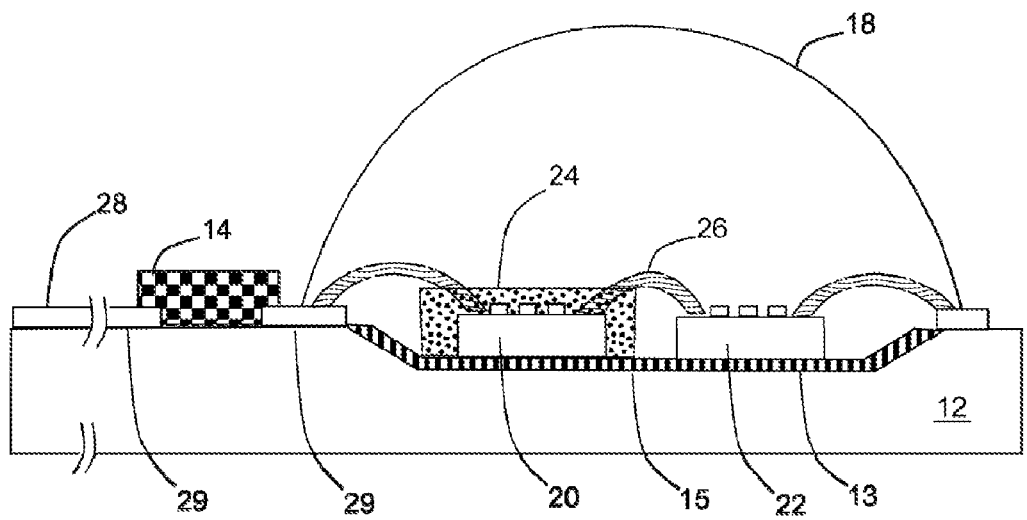
FIG. 3 shows a cross-sectional view of the white light LED shown in FIG. 1.

FIG. 3 shows a cross-sectional view of the white light LED 10 shown in FIG. 1. The submount 12 can be a ceramic substrate with good thermal conducting coefficient, which can be manufactured by processes such as a thick film process, low temperature co-fired ceramic (LTCC) process, and a thin film process. The metal strips 29 can be formed on the submount through a circuit printing process or a lithography process. In this embodiment, a blue light-emitting diode die 20 and a red light-emitting diode die 22 are placed in one of the recess 13 on the submount 12. In this embodiment, the blue light-emitting diode die is a light-emitting diode emitting a first light having a main wavelength between 430 nm and 480 nm; the red light-emitting diode die is another light-emitting diode emitting a second light having a main wavelength between 600 nm and 660 nm. A phosphor layer 24 is formed on the blue light-emitting diode die 20. The phosphor layer 24 is excited by the first light emitted from the blue light-emitting diode die 20, such as blue light or ultraviolet light, to emit a third light with a main wavelength between 540 nm and 590 nm, such as yellow light or yellow-green light. In an embodiment disclosed in FIG. 3, the phosphor layer 24 is not formed on the red light-emitting diode die 22. Transparent or translucent resin 18 seals the blue light-emitting diode die 20 and the red light-emitting diode die 22 in the recess 13. The resin 18 can also be configured as an optical lens to control the emitting angle of the light. In another example, phosphor particles can be substantially distributed uniformly within the resin 18 and cover the blue light-emitting diode die 20 and the red light-emitting diode die 22. A reflective layer 15 is formed in the recess 13 to reflect the light emitted by the blue light-emitting diode die 20 and the red light-emitting diode die 22 in a direction toward the reflective layer 15 in order to increase the luminance in a direction toward the resin 18. The blue light-emitting diode die 20 and the red light-emitting diode die 22 are connected to each other through the bonding wire 26 made of gold or cooper. The bonding wire 26 also provides an electrical connection from the submount 12 to the blue light-emitting diode die 20 and the red light-emitting diode die 22. The electric unit 14 can be a rectifier, a resistor or a capacitor formed between two metal lines 29. Some of the metal lines 29 are functioned as bonding pads 28 configured as input nodes of the high voltage utility power in an alternating mode.

Figure 4:
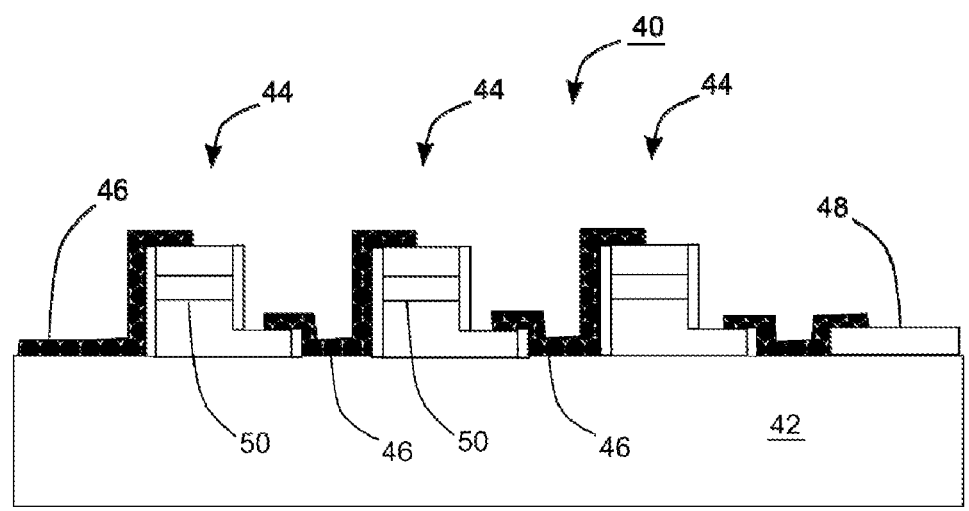
FIG. 4 shows a light-emitting diode in accordance with an embodiment of the present disclosure.

FIG. 4 shows a light-emitting diode die 40 which can be one of the light-emitting diode die 32a~32d shown in FIG. 1. The substrate 42 can be a sapphire substrate, and a plurality of LED units 44, conductive strips 46, and bonding pads 48 are formed thereon. The LED units 44 can be arranged as an array on the substrate 42 and emit lights with light spectrums which are substantially the same with each other. Every LED unit 44 has an emitting interface 50, and the semiconductor material composed of the LED unit 44 decides the color of each LED unit 44. For example, AlGaInP is used for a red LED unit, and InGaN is used for a green, blue, purple and ultraviolet LED unit. The LED units 44 are connected to each other through the conductive strips 46 and the conductive strips 46 also electrically connect the LED units 44 and the bonding pads 48.

Figure 5:
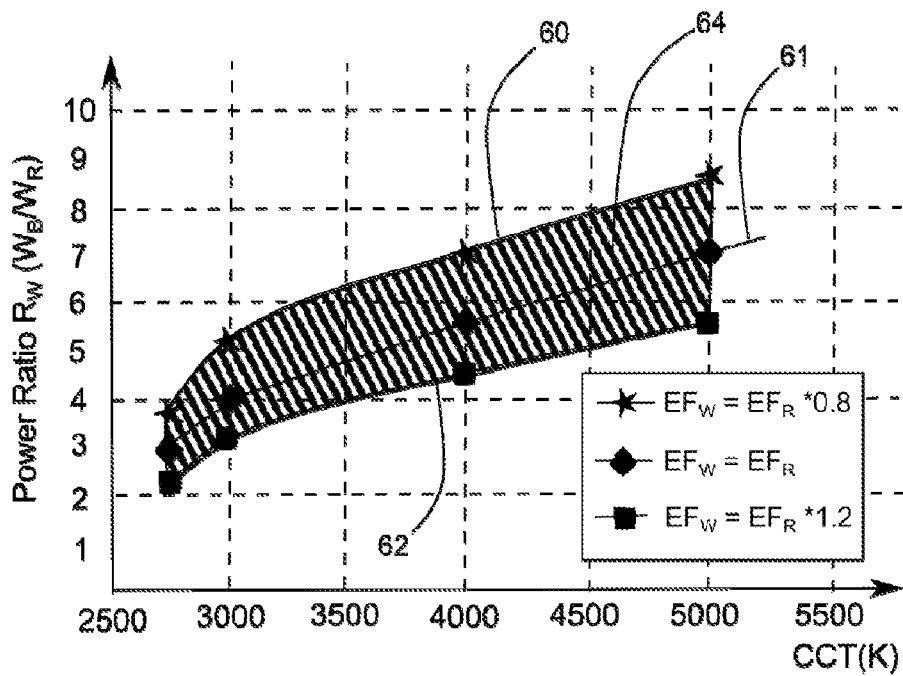
FIG. 5 shows a relationship between the correlated color temperature $T_N$ and the power efficiency ratio $R_W$.

FIG. 5 shows the relationship between the correlated color temperature $T_N$ and the power efficiency ratio $R_W$ of the white light LED 10 shown in FIG. 1 wherein the correlated color temperature $T_N$ is evaluated by Kelvin scale (° K). In this specification, the power efficiency ratio $R_W$ represents a ratio of the total power efficiency of all blue light-emitting diode dies (assumed to be $W_B$) in a white light LED to the total power efficiency of all red light-emitting diode dies (assumed to be $W_R$) in a white light LED, that is $R_W = W_B/W_R$. In FIG. 5, line 60 (star), line 61 (diamond), and line 62 (square) are measured results of three white LED in accordance with embodiments of this application. In this embodiment, the light-emitting efficiency $EF_B$ of the blue light-emitting diode is defined as the luminous flux of the blue light per power unit. The light-emitting efficiency $EF_w$ of a blue light-emitting diode is defined as the luminous flux of a light mixture per power unit wherein the light mixture is consisted of a blue light (first light) and a yellow-green light (third light) generated by the phosphor layer. The light-emitting efficiency $EF_R$ of the red light-emitting diode is defined as the luminous flux of the red light (second light) per power unit. The ratio of the light-emitting efficiency is defined by a ratio between the light-emitting efficiency $EF_w$ and the light-emitting efficiency $EF_R$. The ratios of the light-emitting efficiency ($EF_w/EF_R$) measured in FIG. 5 are 0.8 (line 60), 1 (line 61), and 1.2 (line 62). The line 60 represents the $R_W=7.67*\ln(T_N)-56.6$; the line 62 represents the $R_W=5.01*\ln(T_N)-37.2$. The hatch region 64 locates between the line 60 and the line 62. According to the desired correlated temperature $T_N$ (or the power efficiency ratio $R_W$), by virtue of lines 61, 62 and 63, the power efficiency ratio $R_W$ (or the correlated temperature $T_N$) is designed to locate within the hatch region 64 and the CRI of the white light LED 10 can be larger than 85.

Once a lighting system is designed to provide a desired correlated color temperature, the number of the blue light-emitting diode dies and the red light-emitting diode dies are decided by virtue of the FIG. 5. For example, a blue light-emitting diode die comprises 12 blue LED units and each of the blue LED unit has a forward operation voltage $V_F$ of about 3.1 volt, and a red light-emitting diode die comprises 6 red LED units and each of the red LED unit has a forward operation voltage $V_F$ of about 2 volt. Thus, each blue light-emitting diode die has a forward operation voltage of about 37.2 volt (37.2 V=3.1 V*12) and each red light-emitting diode die has a forward operation voltage of about 12 volt (12 V=2 V*6). According to FIG. 5, if the desired correlated color temperature $T_N$ is 4000° K, the efficiency ratio $R_W$ should be between 7.015 and 4.353. Then, 5 blue light-emitting diode dies are connected to 3 red light-emitting diode dies in series to provide a power efficiency ratio $R_W$ about 5.16 (5.16=(37.2*5)/(12*3)) and a forward operation voltage about 222 V (222=37.2*5+12*3) which can be substantially adapted to an utility power in an alternating mode of 220V or 240 V for the application of lighting and reaches a correlated temperature 4000° K with high CRI.

Figure 6:
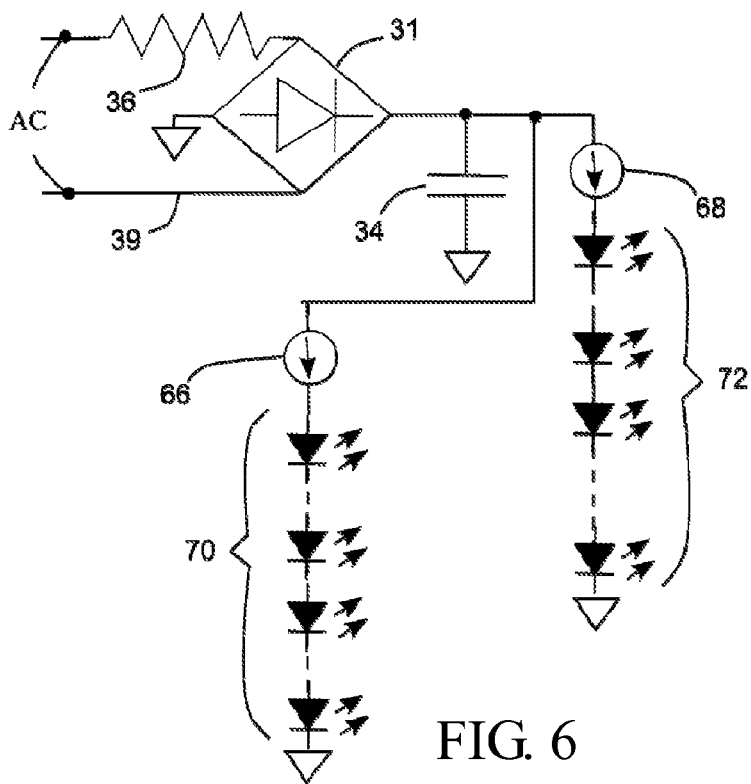
FIG. 6 shows an embodiment of the present disclosure.

Although all LED units are connected in series in the embodiment in FIG. 2, the presented application does not limit the embodiment. FIG. 6 shows another embodiment of the application, wherein the blue light-emitting diode units 70 are connected in series to be driven by a fixed current source 66, and the red light-emitting diode units 72 are connected in series to be driven by a fixed current source 68. The blue light-emitting diode units 70 and red light-emitting diode units 72 are placed on one submount to form a series-connected structure or a parallel-connected structure through metal stripes or bonding wires on the submount. The fixed current source 66 and the fixed current source 68 make the power efficiency ratio $R_W$ of the blue light-emitting diode units 70 to red light-emitting diode units 72 locate in the hatched region 64 in FIG. 5 to obtain a desired correlated temperature and CRI. All the blue light-emitting diode units 70 can be formed in one blue light-emitting diode die or separately formed in different blue light-emitting diode dies. Similarly, all the red light-emitting diode units 72 can be formed in one red light-emitting diode die or separately formed in different red light-emitting diode dies. In the embodiment shown in FIG. 6, the blue light-emitting diode units 70 and the red light-emitting diode units 72 are connected in parallel. Because the current passes through the blue light-emitting diode units 70 and the current passes through the red light-emitting diode units 72 are independent, the desired correlated color temperature is obtained by properly adjusting numbers of diodes and the amount of the fixed current source to tune the power efficiency ratio $R_W$ within the hatched region 62.

In an embodiment of this application, the blue light (first light) emitted by the blue light-emitting diode and the yellow-green light (third light) emitted by the phosphor layer are mixed to be a white light. The light-emitting efficiency $EF_w$ is between 100 and 200 luminance per watt, and the light-emitting efficiency $EF_R$ is between 100 and 200 luminance per watt. The operation temperature of the submount of the white LED is between 60 to 100° C. In an embodiment, the efficiency $EF_R$ and the efficiency $EF_w$ are both larger than 100 luminance per watt.

In an embodiment in accordance with this application, the phosphor layer turning a blue light from a blue light-emitting diode die to a yellow light or a yellow-green light comprises at least an element selected from a group consisted of Mg, Ca, Ba, Sr, Zn, Pr, Nd, Dy, Er, Ho, Y, Ce and Al. The phosphor layer can comprise phosphor material having one chemical composition or phosphor materials having two or more chemical compositions.

Figure 7:
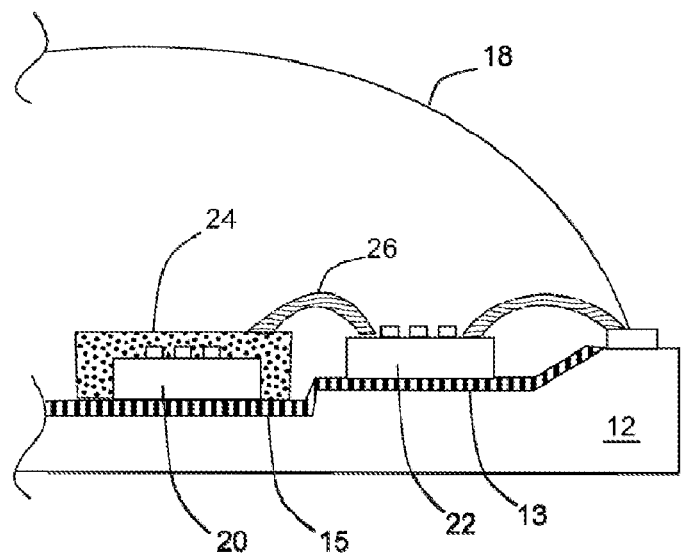
FIG. 7 shows a blue light-emitting diode and a red light-emitting diode arranged on different planes.

The blue light-emitting diode die 20 and the red light-emitting diode die 22 in FIG. 3 are fixed on the submount 12 at the same horizontal level, but the application is not limited to the embodiment. In the embodiment in FIG. 7, the blue light-emitting diode die 20 and the red light-emitting diode die 22 are placed on different horizontal levels. The distance between the red light-emitting diode die 22 and the submount 12 is larger than the distance between the blue light-emitting diode die 20 and the submount. The shape of the light emitted by a lighting apparatus can be changed by arranging the positions of the blue light-emitting diode die 20 and the red light-emitting diode die 22.

Figure 8:
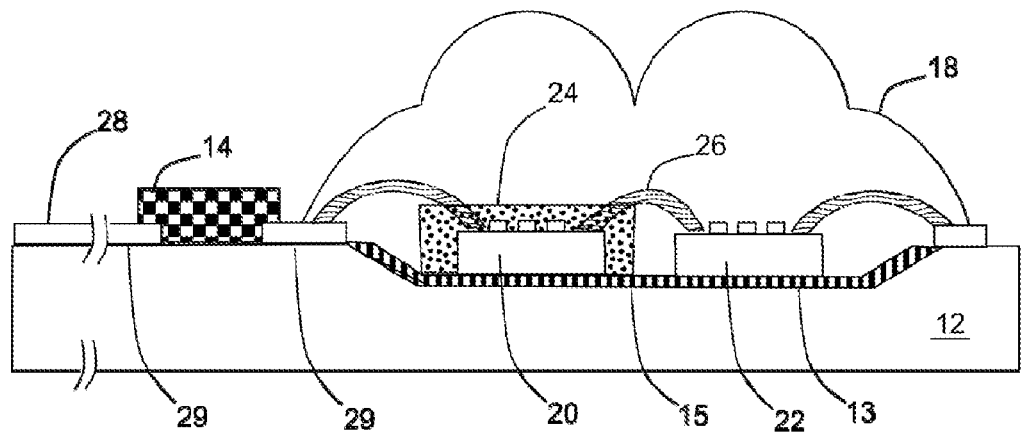
FIG. 8 shows a white light-emitting diode having several optical lenses.

The application is not restricted to the embodiment in FIG. 3, wherein the light-emitting diode dies are covered by only one optical lens. In another embodiment shown in FIG. 8, a plurality of lenses is respectively disposed on the light-emitting diode dies.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A lighting apparatus for emitting a white light having a correlated color temperature $T_N$ at a light efficiency large than 100 lm/W, comprising: a light-emitting diode die configured to emit a first light and having a first light-emitting efficiency and a first power; a second light-emitting diode die configured to emit a second light and having a second light-emitting efficiency and a second power; and an electrical-connection structure connecting the first light-emitting diode die and the second light-emitting diode die; wherein a power ratio of the first power to the second power is about between $7.67*\ln(T_N)-56.6$ and $5.01*\ln(T_N)-37.2$, where $T_N$ is in Kelvin (K).

2. The lighting apparatus of claim 1, wherein the first light is blue light or ultraviolet light.

3. The lighting apparatus of claim 1, further comprising a submount, wherein the first light-emitting diode die and the second light-emitting diode die are fixed on the submount at a same horizontal level.

4. The lighting apparatus of claim 1, further comprising a first lens arranged on the first light-emitting diode die and a second lens arranged on the second light-emitting diode die.

5. The lighting apparatus of claim 1, further comprising a first current source connected to the first light-emitting diode die and a second current source connected to the second light-emitting diode die.

6. The lighting apparatus of claim 1, wherein the first light-emitting diode die or the second light-emitting diode die comprises two LED units connected with each other by a conductive strip.

7. The lighting apparatus of claim 6, wherein the conductive strip covers a side wail of the two LED units.

8. The lighting apparatus of claim 1, wherein the power ratio is larger than 2, the correlated color temperature $T_N$ is between 2500-3000K.

9. The lighting apparatus of claim 1, wherein the power ratio is larger than 5, the correlated color temperature $T_N$ is larger than 4500K.

10. The lighting apparatus of claim 1, wherein a ratio of the light-emitting efficiency to the second light-emitting efficiency is between 0.8-1.2.

11. The lighting apparatus of claim 1, further comprising:
    a current limiting resistor; and
    a rectifier connecting the current g resistor and the first light-emitting diode die.

12. The lighting apparatus of claim 11, further comprising a lens covering the first light-emitting diode die without covering the current limiting resistor.

13. The lighting apparatus of claim 1, wherein the correlated color temperature is between 2500K-5500K.

14. The lighting apparatus of claim 1, further comprising a submount, wherein the first light-emitting diode die and the second light-emitting diode die are fixed on the submount at different horizontal levels.

15. The lighting apparatus of claim 14, wherein a distance between the submount and the second light-emitting diode die is larger than that between the submount and the first light-emitting diode die.

16. The lighting apparatus of claim 1, further comprising a phosphor layer optically coupled to the first light-emitting diode die and excited by the first light to emit a third light.

17. The lighting apparatus of claim 16, wherein the phosphor layer covers the first light-emitting diode die and the second light-emitting diode die.

18. The lighting apparatus of claim 16, wherein the phosphor layer covers the first light-emitting diode die but not covers the second light-emitting diode die.

19. The lighting apparatus of claim 16, wherein the phosphor layer comprises two phosphor materials having different chemical compositions.

20. The lighting apparatus of claim 16, wherein the first light and the third light are mixable to be a white light.

* * * * *